(12) United States Patent
Lee et al.

(10) Patent No.: US 9,294,103 B2
(45) Date of Patent: Mar. 22, 2016

(54) PRE-PROGRAM OF CLOCK GENERATION CIRCUIT FOR FASTER LOCK COMING OUT OF RESET

(71) Applicant: Apple Inc., Cupertino, CA (US)

(72) Inventors: Jong-Suk Lee, Sunnyvale, CA (US); Shih-Chieh R. Wen, San Jose, CA (US); Toshinari Takayanagi, San Jose, CA (US); Wei-Han Lien, San Jose, CA (US)

(73) Assignee: Apple Inc., Cupertino, CA (US)

( * ) Notice: Subject to any disclaimer, the term of this patent is extended or adjusted under 35 U.S.C. 154(b) by 195 days.

(21) Appl. No.: 14/180,976

(22) Filed: Feb. 14, 2014

(65) Prior Publication Data

US 2015/0236705 A1    Aug. 20, 2015

(51) Int. Cl.
  *H03L 7/06*  (2006.01)
  *H03L 7/08*  (2006.01)
  *H03K 5/00*  (2006.01)

(52) U.S. Cl.
  CPC .............. *H03L 7/08* (2013.01); *H03K 5/00006* (2013.01)

(58) Field of Classification Search
  CPC .......................................................... H03L 7/08
  USPC ........................................................ 327/156
  See application file for complete search history.

(56) References Cited

U.S. PATENT DOCUMENTS

| | | | |
|---|---|---|---|
| 5,142,247 A * | 8/1992 | Lada, Jr. .................... | H03L 7/18 331/14 |
| 5,420,545 A * | 5/1995 | Davis ....................... | H03L 7/107 331/16 |
| 5,497,126 A | 3/1996 | Kosiec et al. | |
| 5,586,309 A | 12/1996 | Lin | |
| 5,952,890 A * | 9/1999 | Fallisgaard ............ | H03B 5/366 331/158 |
| 6,229,399 B1 * | 5/2001 | Tobise .................... | H03L 7/093 327/147 |
| 6,236,275 B1 * | 5/2001 | Dent ...................... | H03L 7/0898 327/106 |
| 6,377,129 B1 * | 4/2002 | Rhee ...................... | H03K 3/354 331/111 |
| 6,504,437 B1 * | 1/2003 | Nelson ................... | H03L 7/1972 331/14 |
| 6,621,356 B2 * | 9/2003 | Gotz ...................... | H03L 7/1976 327/156 |
| 6,704,908 B1 | 3/2004 | Horan et al. | |
| 6,946,884 B2 * | 9/2005 | Holland ................. | H03L 7/1976 327/115 |
| 7,336,755 B1 * | 2/2008 | Tetzlaff ................. | H03L 7/18 327/156 |
| 2010/0097149 A1 * | 4/2010 | Yeung ..................... | G06F 1/12 331/18 |
| 2011/0019767 A1 | 1/2011 | Lamanna et al. | |
| 2013/0191665 A1 * | 7/2013 | Mehta ..................... | G06F 1/324 713/322 |

FOREIGN PATENT DOCUMENTS

EP        1030453        8/2000

* cited by examiner

*Primary Examiner* — Ryan Jager
(74) *Attorney, Agent, or Firm* — Meyertons, Hood, Kivlin, Kowert & Goetzel, P.C.; Erik A. Heter

(57) ABSTRACT

A method and apparatus for achieving fast PLL lock when exiting a low power state is disclosed. In one embodiment, a method includes operating a PLL in a first state in which the PLL is locked to a first frequency. The method further includes programming the PLL to operate in a second state in which the PLL is locked to a second frequency. The programming may occur while the PLL is operating in the first state, and the PLL may continue operating in the first state after programming is complete. Thereafter, the PLL may be transitioned from the first state to a low power state. Upon exiting the low power state, the PLL may transition directly to the second state, locking to the second frequency, without having to transition to the first state or lock to the first frequency.

20 Claims, 5 Drawing Sheets

PRE-PROGRAM OF CLOCK GENERATION CIRCUIT FOR FASTER LOCK COMING OUT OF RESET

BACKGROUND

1. Technical Field

This disclosure is directed to electronic circuits, and more particularly, to circuits used for generating clock signals.

2. Description of the Related Art

Many integrated circuits (ICs) have clock generation circuits implemented thereon. The clock circuits may be used to generate clock signals that are provided to various clocked circuits, such as synchronous logic circuits implemented on the corresponding IC.

One common type of clock generation circuit is the phase locked loop (PLL). A PLL is a feedback-based system in which a phase difference between a reference signal and a feedback signal. A typical PLL includes a phase detector, a low pass filter, an oscillator, and a feedback path. Some PLLs may have additional circuitry, such as multipliers, dividers, and so forth.

In some cases, portions of an IC in which a PLL is implemented may be placed in a low-power mode, such as a sleep mode, in which idle circuitry is powered down. In some cases, portions of the PLL may also be powered down. When exiting the low-power mode, the PLL may re-lock to the frequency at which it was locked prior to the powering down of portions thereof.

SUMMARY

A method and apparatus for achieving fast PLL lock when exiting a low power state is disclosed. In one embodiment, a method includes operating a PLL in a first state in which the PLL is locked to a first frequency. The method further includes programming the PLL to operate in a second state in which the PLL is locked to a second frequency. The programming may occur while the PLL is operating in the first state, and the PLL may continue operating in the first state after programming is complete. Thereafter, the PLL may be transitioned from the first state to a low power state. Upon exiting the low power state, the PLL may transition directly to the second state, locking to the second frequency, without having to transition to the first state or lock to the first frequency.

In one embodiment, a PLL includes an analog portion and a digital portion. When placed in a low power state, the digital portion may be powered down, while the analog portion may remain powered on. The digital portion may be programmed to operate in a particular state which includes the PLL locking to a particular frequency. In one embodiment, the state may include a number of programmable parameters, including divisors used in one or more dividers, and a multiplication factor used in one or more multiplier circuits.

BRIEF DESCRIPTION OF THE DRAWINGS

The following detailed description makes reference to the accompanying drawings, which are now briefly described.

Figure 1:
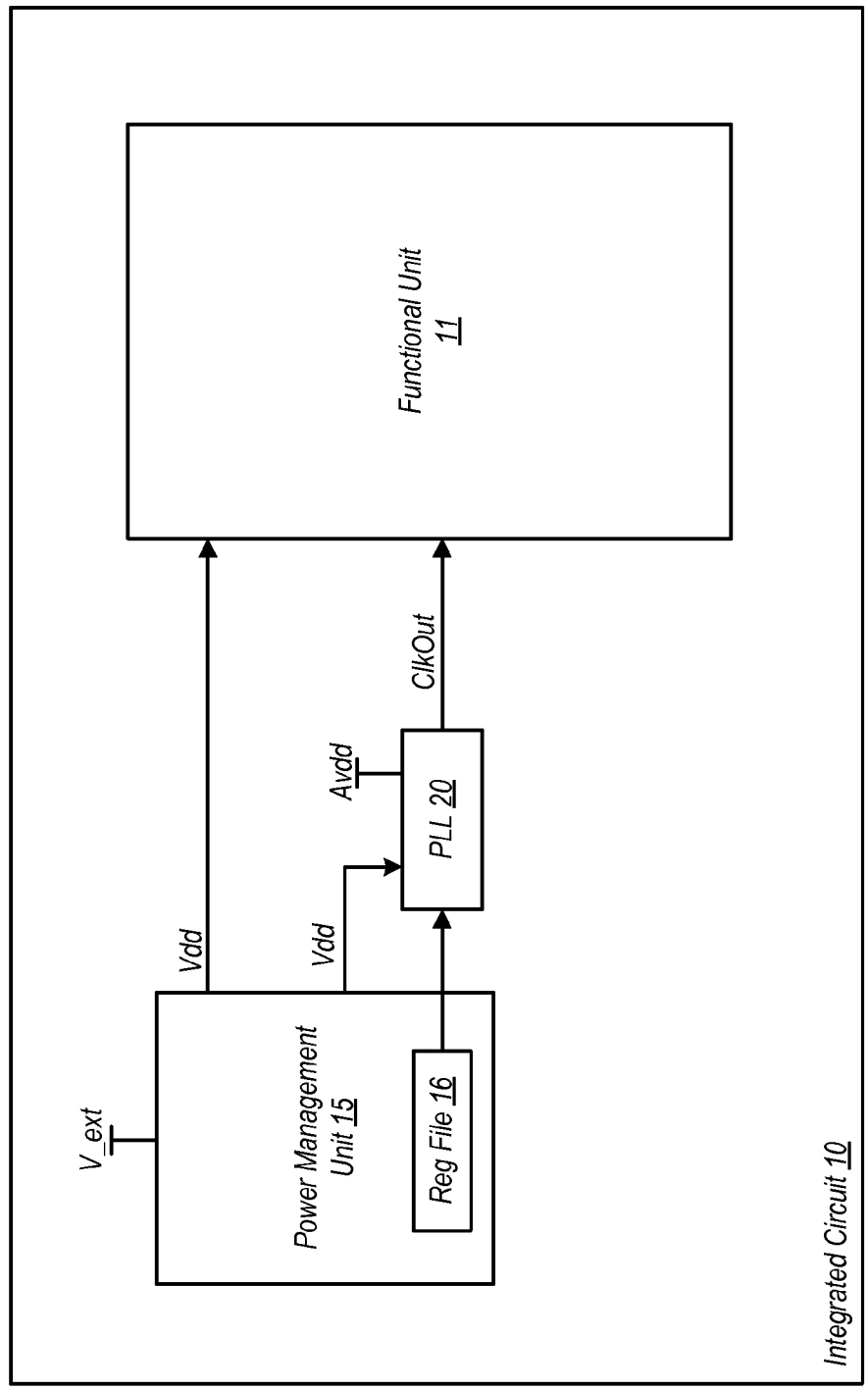
FIG. 1 is a block diagram of one embodiment of an integrated circuit (IC).

While the disclosed subject matter is susceptible to various modifications and alternative forms, specific embodiments thereof are shown by way of example in the drawings and will herein be described in detail. It should be understood, however, that the drawings and detailed description thereto are not intended to limit the subject matter to the particular form disclosed, but on the contrary, the intention is to cover all modifications, equivalents and alternatives falling within the spirit and scope of the disclosed subject matter as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of one embodiment of an IC is shown. IC 10 is an exemplary embodiment used to illustrate various aspects of this disclosure, but is not intended to be limiting. On the contrary, the method and apparatus embodiments (and variations thereof) discussed below may be used in a wide variety of IC embodiments.

IC 10 in the embodiment shown includes a functional unit 11 configured to provide the primary functionality of the device. Among the circuits included in functional unit 11 are a number of clocked circuits, i.e., sequential circuits synchronized to a clock signal. The clock signal (ClkOut) in the embodiment shown is provide by a phase locked loop (PLL) 20. Various embodiments of a PLL 20 will be discussed in further detail below.

IC 10 also includes a power management unit 15 coupled to both functional unit 11 and PLL 20. Power management unit 15 may provide power control functions for IC 10. Among these functions include placing functional unit 11 and/or PLL 20 in low power states when functional unit 11 is idle, or when conducting a reset of IC 10. Power management unit 15 is configured to receive a voltage, V_ext, from an external source, and may provide a corresponding voltage Vdd to functional unit 11 as well as to portions of PLL 20. When placing functional unit 11 and PLL 20 in a low power state, power management unit 15 may turn off the voltage Vdd that is provided to these blocks.

As will be discussed below, PLL 20 includes both analog and digital portions. The digital portions of PLL 20 are coupled to receive Vdd from power management unit 15. The analog portions are coupled to receive a separate voltage, AVdd from a different source that is not controlled by power management unit 15. Accordingly, in one embodiment, placing PLL 20 in a low power state may comprise powering down the digital portions thereof, while the analog portions thereof may remain powered on.

Power management unit 15 in the embodiment shown includes a register file 16, which may include a number of registers. The registers in register file 16 may be used to store various types of configuration information used by power management unit 15 or one of the other units coupled thereto. In this particular embodiment, register file 16 may include a number of registers used to program various parameters of PLL 20. Based on the programmed parameters, PLL 20 may operate in a corresponding state. The corresponding state may include PLL 20 locking to a particular frequency, wherein the frequency is set by the programmed parameters.

In exemplary embodiments discussed below, register file 16 may include first, second, and third registers for programming PLL 20. A first register may be programmed with a divisor for a pre-divider used to divide a frequency of a reference clock signal, a second register may be programmed with a multiplication factor used by a multiplier circuit, and third register may be programmed with a divisor used for a second divider used to divide a frequency of a periodic signal output by the analog portion of PLL 20. It is noted that in some embodiments, programming registers may be located in other areas of IC 10 outside of power management unit 15. In some embodiments of PLL 20, the registers may be included in a portion of PLL 20 that remains powered on while other portions are powered down.

When PLL 20 is exiting a state in which it is powered down, it may read the divisor and multiplier information in the corresponding ones of register file 16. Thereafter, PLL 20 may begin operation in a state according to the parameters read from the registers. During operation, if a change of state is desired, PLL 20 may re-access the registers to obtain newly programmed values. Alternatively, in some embodiments, newly programmed values may be pushed to PLL 20 without an explicit request therefrom.

Figure 2:
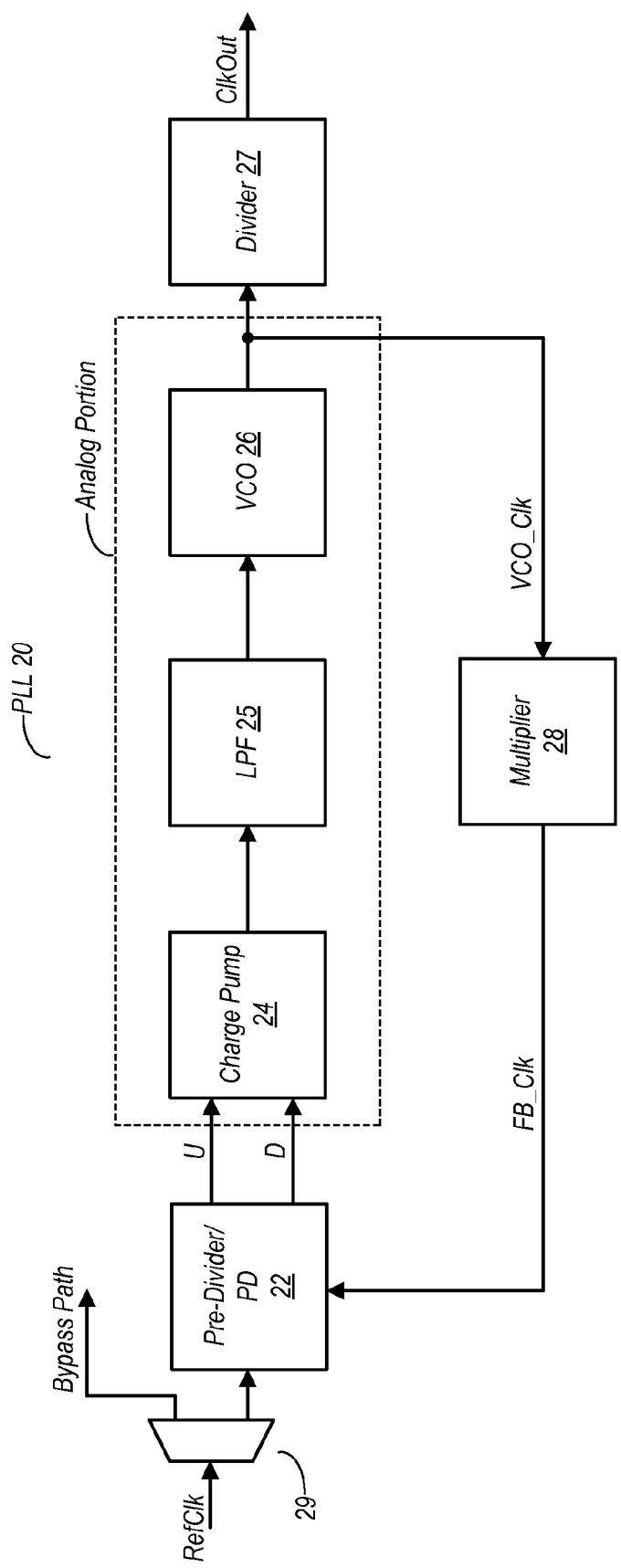
FIG. 2 is a block diagram of one embodiment of a phase locked loop (PLL).
Figure 3:
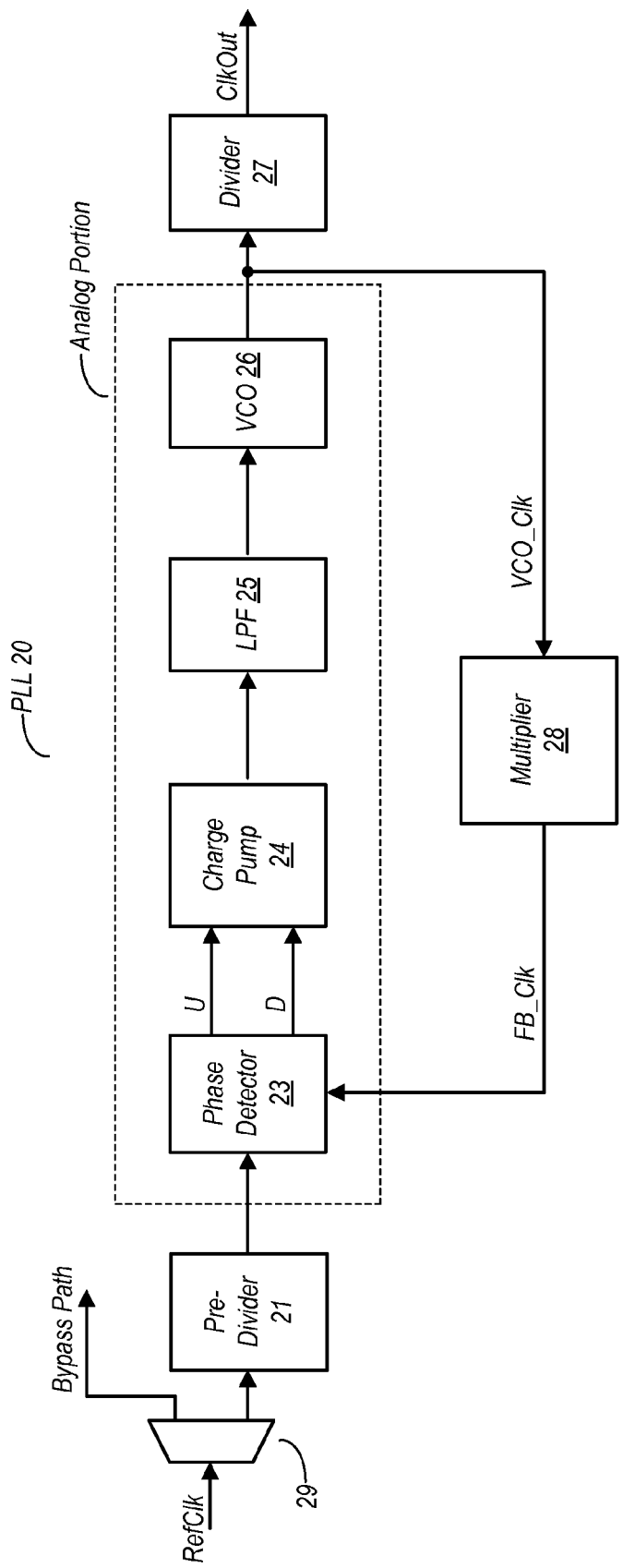
FIG. 3 is a block diagram of another embodiment of a PLL.

FIGS. 2 and 3 respectively illustrate two different embodiments of PLL 20. In the embodiment shown in FIG. 2, pre-divider/phase detector unit 22 is coupled to receive a reference clock signal ('RefClk') via bypass circuit 29. Pre-divider/phase detector 22 is also coupled to receive a feedback clock signal, 'FB_Clk'. The pre-divider portion may divide the frequency of the reference clock signal, thereby reducing a frequency-divided reference clock signal having a lower frequency than the original for any programmed divisor greater than one. The phase detector portion in this embodiment is a digital phase detector that may detect a phase difference between the frequency-divided reference clock signal and the feedback clock signal.

PLL 20 in the embodiment shown includes an analog circuit portion having a charge pump 24, a low pass filter 25, and voltage controlled oscillator (VCO) 26. Charge pump 24 in the embodiment shown receives up ('U') and down ('D') signals from pre-divider/phase detector 22 and generates a corresponding voltage based on the received signals. The voltage is passed through low pass filter 25, to VCO 26, which generates a periodic signal, 'VCO_Clk', based thereon. This signal is provided to divider 27, as well as to multiplier 28.

It is noted that the circuits shown in the analog portion of PLL 20 may receive the AVdd supply voltage discussed above, and may remain powered on when other units of PLL 20 are placed in a low power state.

As noted above, the VCO_Clk signal is provided by VCO 26 to both divider 27 and multiplier 28. Divider 27 may divide the frequency of the VCO_Clk signal by the programmed divisor value, thereby providing the output clock signal, 'Clk_Out', at a frequency that is less than that of the VCO_Clk signal for any divisor greater than one. The FB_Clk signal may be produced by multiplier circuit 28 multiplying the frequency of VCO_Clk signal. Thus the FB_Clk signal may have a frequency greater than the VCO_Clk signal for any programmed multiplication factor greater than one.

The embodiment of PLL 20 shown in FIG. 3 primarily differs from that of FIG. 2 in that pre-divider 21 and phase detector 23 are implemented separately from one another. Moreover, phase detector 23 is implemented as analog circuitry, and thus may receive power from AVdd along with the other analog components shown. Furthermore, FB_Clk is provided from multiplier circuit 28 to phase detector 23.

Both embodiments of PLL 20 include a bypass circuit 29 that is coupled to receive the reference clock from an external source (e.g., from an on-chip oscillator, although the source could be off-chip as well). During the normal mode of operation, when PLL is actively providing the Clk_Out signal, the reference clock may pass through to the phase detector, irrespective of whether it is implemented in the digital domain (as in FIG. 2) or the analog domain (as in FIG. 3).

As previously noted, PLL 20 may be programmed to operate in a particular state, either through registers 16 in power management unit 15, or by another programming apparatus not explicitly disclosed here in other embodiments. Programming PLL 20 may cause it to lock to a certain VCO_Clk frequency that may be specified in various ways. For example, in the embodiments of PLL 20 disclosed herein, the frequency of the VCO_Clk signal may be locked to a frequency that is dependent upon the programmed divisor of the pre-divider and the programmed multiplier for the multiplication circuit. The frequency of the Clk_Out signal may be determined in the embodiments of PLL 20 disclosed herein by the following:

$$f = \frac{Ref * M}{P * S},$$

where f is the frequency of Clk_Out, Ref is the frequency of the reference clock signal, M is the programmed multiplier used by multiplier circuit 28, P is the programmed divisor used by the pre-divider (21 or 22), and S is the programmed divisor used by divider 27.

The programmability of PLL 20 may also allow for faster lock times to a new frequency/state upon exit from a reset or power down state. In the various embodiments discussed herein, PLL 20 may be programmed to operate in a second state, prior to powering down, while continuing to operate in the first state. The first state may include locking the PLL to a first frequency, while the second state may include locking to a second frequency. After programming for operation in the second state, PLL 20 may continue operating in the first state until it is powered down (e.g., from entry into a low power sleep state, or from a reset, etc.). Upon exiting the power down state, PLL 20 may load the newly programmed values into its corresponding dividers/multiplier circuits. PLL 20 may then begin operating in the new, second state without having to first operate in the previous, first state.

Thus, the programmability of PLL 20 may enable it to be reprogrammed to come out of a reset or low power state and lock to a new frequency when it is known that the new frequency (and corresponding state) will be desired. In prior art embodiments, a PLL would re-lock to a frequency it was previously locked to upon exiting a reset/power down state. If it was desired to lock to a new frequency, the PLL would first have to lock to the previous frequency it was locked to just prior to reset, and then lock to the new frequency thereafter. This consumed a significant amount of time in locking to the new frequency, which could cause further delays in resuming operation of functional units receiving a clock signal from the PLL. In contrast, PLL 20 may begin entry into the second state directly upon exit from the low power state and lock to the second frequency in less time. For example, if PLL 20 is capable of locking to a new frequency responsive to a state change in 5 μs, the ability to go directly to the second state may save 5 μs over embodiments wherein entry into the first state and lock to the first frequency is required before proceeding to the second.

Figure 4:
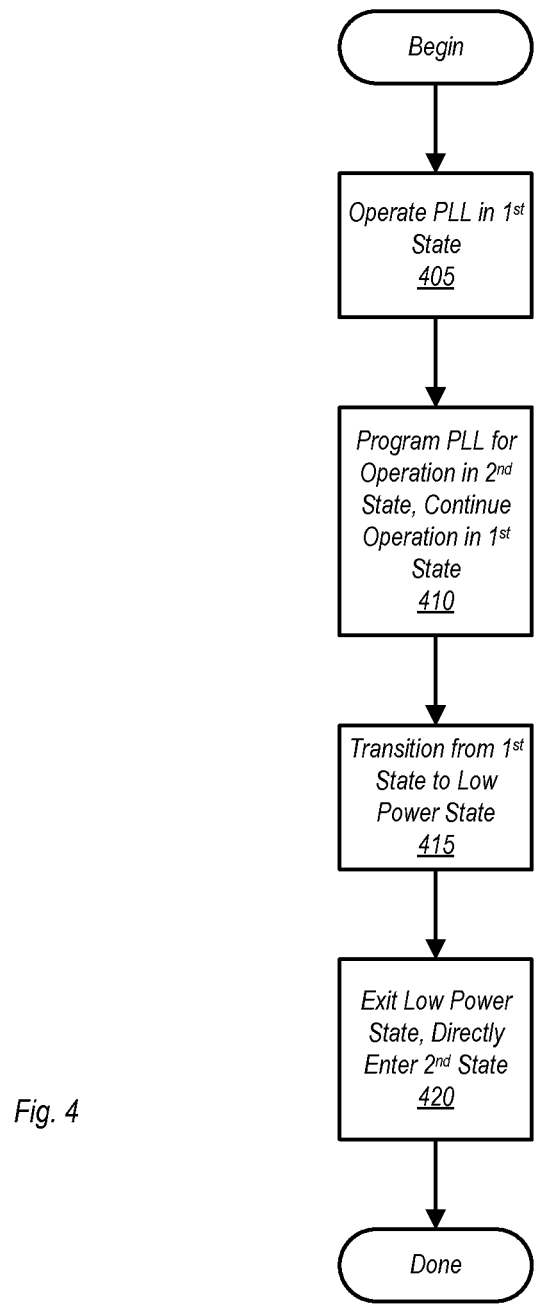
FIG. 4 is a flow diagram illustrating one embodiment of a method for operating a PLL.

Turning now to FIG. 4, a flow diagram illustrating one embodiment of a method for operating a PLL prior and subsequent to a power down state is shown. Method 400 as discussed herein may be used with various embodiments of IC 10 and PLL 20, as well as with other embodiments not explicitly discussed herein.

Method 400 begins with the operation of a PLL in a first state (block 405). Operation in the first state includes the PLL being locked to a first frequency. During operation in the first state, the PLL may be programmed for operation in a second state, even though it continues operation in the first state (block 410). Thereafter, the PLL may be transitioned from the first state to a low power state (block 415). During operation in the low power state, certain portions of the PLL (e.g., digital portions, such as dividers and multipliers) may be powered down, while analog portions (e.g., charge pump, VCO) may remain powered on. Sometime after entering the low power state, the PLL may be caused to exit therefrom, and may directly begin entry into the second state (block 420). Entry into the second state may include locking to a second frequency that is different from the first.

Figure 5:
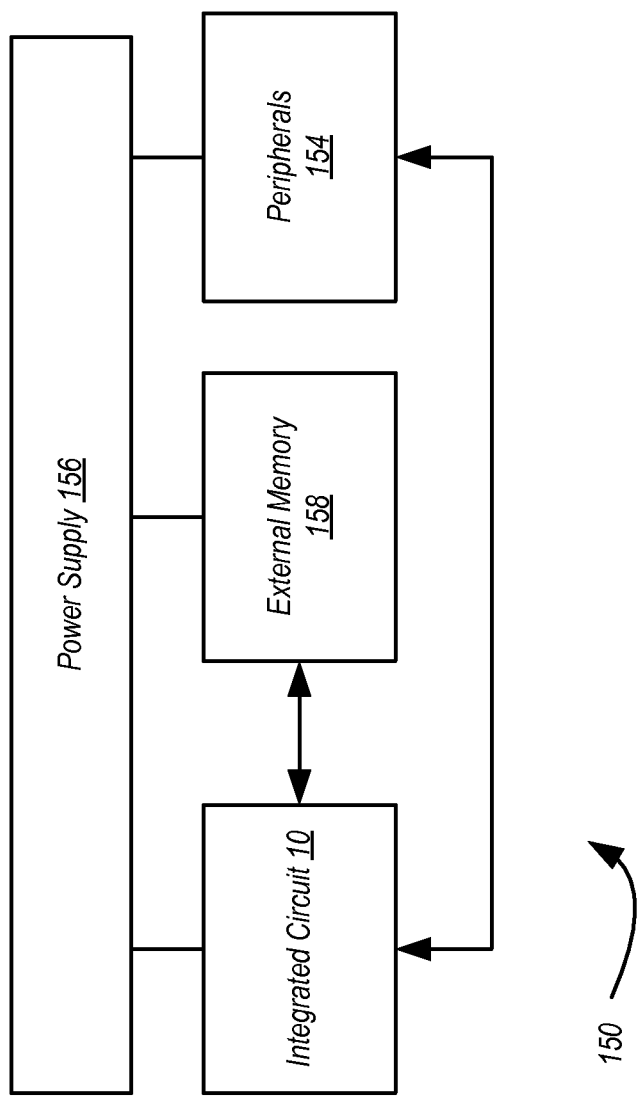
FIG. 5 is a block diagram of one embodiment of an exemplary system.

Turning next to FIG. 5, a block diagram of one embodiment of a system 150 is shown. In the illustrated embodiment, the system 150 includes at least one instance of the integrated circuit 10 coupled to external memory 158. The integrated circuit 10 is coupled to one or more peripherals 154 and the external memory 158. A power supply 156 is also provided which supplies the supply voltages to the integrated circuit 10 as well as one or more supply voltages to the memory 158 and/or the peripherals 154. In some embodiments, more than one instance of the integrated circuit 10 may be included (and more than one external memory 158 may be included as well).

The peripherals 154 may include any desired circuitry, depending on the type of system 150. For example, in one embodiment, the system 150 may be a mobile device (e.g. personal digital assistant (PDA), smart phone, etc.) and the peripherals 154 may include devices for various types of wireless communication, such as WiFi, Bluetooth, cellular, global positioning system, etc. The peripherals 154 may also include additional storage, including RAM storage, solid-state storage, or disk storage. The peripherals 154 may include user interface devices such as a display screen, including touch display screens or multitouch display screens, keyboard or other input devices, microphones, speakers, etc. In other embodiments, the system 150 may be any type of computing system (e.g. desktop personal computer, laptop, workstation, tablet, etc.).

The external memory 158 may include any type of memory. For example, the external memory 158 may be SRAM, dynamic RAM (DRAM) such as synchronous DRAM (SDRAM), double data rate (DDR, DDR2, DDR3, LPDDR1, LPDDR2, etc.) SDRAM, RAMBUS DRAM, etc. The external memory 158 may include one or more memory modules to which the memory devices are mounted, such as single inline memory modules (SIMMs), dual inline memory modules (DIMMs), etc.

Numerous variations and modifications will become apparent to those skilled in the art once the above disclosure is fully appreciated. It is intended that the following claims be interpreted to embrace all such variations and modifications.

What is claimed is:

1. A method comprising:
   operating a phase locked loop (PLL) in a first state;
   programming the PLL to operate in a second state while the PLL operates in the first state;
   transitioning the PLL from the first state to a low power state; and
   transitioning the PLL from the low power state directly into the second state.

2. The method as recited in claim 1, wherein operating in the first state comprises the PLL outputting a clock signal having a first frequency, and wherein operating in the second state comprises the PLL outputting a clock signal having a second frequency different from the first frequency.

3. The method as recited in claim 1, wherein programming the PLL comprises programming values into one or more registers, wherein each of the registers is associated with a corresponding one of one or more parameters that define an operating state for the PLL.

4. The method as recited in claim 3, wherein programming the PLL comprises programming a register with a value used as a divisor for a divider configured to divide a frequency of a reference clock signal received by the PLL.

5. The method as recited in claim 3, wherein programming the PLL comprises programming a register with a value used as a divisor for dividing a frequency a periodic signal output from an analog portion of the PLL.

6. The method as recited in claim 3, wherein programming the PLL comprises programming a register with a value used to multiply, using a multiplier, a frequency of a periodic signal output from an analog portion of the PLL, wherein the multiplier is in a feedback path of the PLL.

7. The method as recited in claim 1, further comprising bypassing a reference clock received by the PLL to an output of the PLL when operating in the low power state.

8. An apparatus comprising:
   a programmable phase locked loop (PLL);
   a functional unit coupled to receive a clock signal from the PLL; and
   a power management circuit configured to place the functional unit and a portion of the PLL into a low power state, wherein the power management unit is configured to, when the PLL is operating in a first state prior to transitioning to the low power state:
   program the PLL to operate in a second state;
   transition the PLL and the functional unit into the low power state; and
   responsive to exiting the low power state, cause the PLL to transition directly into the second state.

9. The apparatus as recited in claim 8, wherein, when operating in the first state, the PLL is configured to lock to provide the clock signal at a first frequency, and when operating in the second state, the PLL is configured to lock to provide the clock signal at a second frequency different from the first frequency.

10. The apparatus as recited in claim 8, wherein the PLL includes:
    a first divider configured to divide a frequency of a received reference clock signal;
    an analog circuit portion configured to generate a first periodic signal based in part on a divided-frequency reference clock signal output by the first divider;
    a feedback path including a multiplier, wherein the multiplier is configured to multiply a frequency of the first periodic signal; and
    a second divider coupled to produce a second periodic signal by dividing a frequency of the first periodic signal.

11. The apparatus as recited in claim 10, further comprising a phase detector, wherein the phase detector is coupled to receive the divided-frequency reference clock signal and a third periodic signal from the feedback path, wherein the third periodic signal is a frequency-multiplied version of the first periodic signal.

12. The apparatus as recited in claim 10, wherein programming the PLL comprises writing, to a register, a value to be used as a divisor in the first divider.

13. The apparatus as recited in claim 10, wherein programming the PLL comprises writing to a register, a value to be used as a divisor in the second divider.

14. The apparatus as recited in claim 10, wherein programming the PLL comprises writing to a register a value to be used by the multiplier to multiply the frequency of the first periodic signal.

15. The apparatus as recited in claim 10, wherein the PLL further includes a bypass circuit configured to provide the reference clock signal to an output of the PLL when the portion of the PLL is in the low power state.

16. The apparatus as recited in claim 8, wherein the power management circuit is configured to place the PLL in the low power state by removing power from a digital portion of the PLL, wherein an analog portion of the PLL is configured to remain powered on during operation in the low power state.

17. A method comprising:
    a phase locked loop (PLL) operating in a first state, wherein operating in the first state comprises the PLL being locked to a first frequency;
    programming the PLL to operate in a second state while continuing operation in the first state, wherein operating in the second state comprises the PLL being locked to a second frequency different from the first;
    transitioning the PLL from the first state to a low power state subsequent to said programming; and
    transitioning the PLL directly to the second state responsive to causing the PLL to exit the low power state.

18. The method as recited in claim 17, wherein programming the PLL to operate in the second state comprises:
    writing a first divisor to a first register, wherein the first divisor is used to divide a frequency of a reference clock signal received by the PLL;
    writing a second divisor to a second register, wherein the second divisor is used to divide a frequency of a periodic output signal provided from an output of an analog portion of the PLL;
    writing a multiplier to a second register, wherein the multiplier is used by a multiplication circuit to multiply the frequency of the periodic output signal to produce a feedback signal.

19. The method as recited in claim 18, further comprising bypassing the reference clock signal to an output of the PLL during operation in the low power state.

20. The method as recited in claim 17, wherein placing the PLL in the low power state comprises powering down digital portions of the PLL while analog portions of the PLL remain powered on.

\* \* \* \* \*